US010469242B2

(12) United States Patent
Chen et al.

(10) Patent No.: US 10,469,242 B2
(45) Date of Patent: Nov. 5, 2019

(54) MULIT-LANE SYNCHRONOUS RESET FOR COHERENT RECEIVERS

(71) Applicant: MACOM Technology Solutions Holding, Inc., Lowell, MA (US)

(72) Inventors: Yanfei Chen, Santa Clara, CA (US); Hiva Hedayati, Santa Clara, CA (US)

(73) Assignee: MACOM TECHNOLOGY SOLUTIONS HOLDING, INC., San Jose, CA (US)

( * ) Notice: Subject to any disclaimer, the term of this patent is extended or adjusted under 35 U.S.C. 154(b) by 0 days.

(21) Appl. No.: 16/158,177

(22) Filed: Oct. 11, 2018

(65) Prior Publication Data

US 2019/0238306 A1    Aug. 1, 2019

Related U.S. Application Data

(60) Provisional application No. 62/623,426, filed on Jan. 29, 2018.

(51) Int. Cl.
| H04L 7/00 | (2006.01) |
| H04L 7/033 | (2006.01) |
| H03K 19/20 | (2006.01) |
| H03K 19/017 | (2006.01) |

(52) U.S. Cl.
CPC ..... *H04L 7/0083* (2013.01); *H03K 19/01728* (2013.01); *H03K 19/20* (2013.01); *H04L 7/0337* (2013.01)

(58) Field of Classification Search
CPC ............ H04L 7/0083; H04L 7/0337; H03K 19/01728; H03K 19/20
See application file for complete search history.

(56) References Cited

U.S. PATENT DOCUMENTS

| 10,313,099 B1* | 6/2019 | Li ..................... H04L 7/0033 |
| 2004/0156398 A1* | 8/2004 | Abel ..................... H04J 3/04 |
| | | 370/516 |

* cited by examiner

*Primary Examiner* — Jaison Joseph

(57) ABSTRACT

A reset sub-circuit can sample the reset signal based on a low-speed clock reference signal to generate a series of sampled reset signals. A phase relation between a first selected one of the series of sampled reset signals and the high-speed clock signal at the clock input of each sampler can be measured to generate reset trigger signals corresponding to each of a plurality of samplers. A second selected one of the series of sampled reset signals can be sampled based on the high-speed clock signal to generate a positive sampled reset signal and a negative sampled reset signal. The reset sub-circuit can select between the positive sampled reset signal and the negative sampled reset signal based on the reset trigger signals corresponding to each sampler to generate the synchronous reset signal.

20 Claims, 5 Drawing Sheets

| bi | bq | bib | bqb | rstb trig edge | rstb_t0 |
|---|---|---|---|---|---|
| 1 | 0 | 0 | 1 | neg | 0 |
| 1 | x | 0 | x | neg | 0 |
| 1 | 1 | 0 | 0 | pos | 1 |
| x | 1 | x | 0 | pos | 1 |
| 0 | 1 | 1 | 0 | pos | 1 |
| 0 | x | 1 | x | pos | 1 |
| 0 | 0 | 1 | 1 | neg | 0 |
| x | 0 | x | 1 | neg | 0 |

MULIT-LANE SYNCHRONOUS RESET FOR COHERENT RECEIVERS

CROSS-REFERENCE TO RELATED APPLICATIONS

This Application claims the benefit of U.S. Provisional Patent Application No. 62/623,426 filed Jan. 29, 2018, which is incorporated herein in its entirety.

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. One common aspect of computing devices is serial communications within circuits of the computing devices and between computing devices. A receive may sample a plurality of lanes of serial data, de-serialize the multi-lanes of serial data into parallel data for further processing by a digital signal processor. For high-speed communication, the sampling and de-serialize circuits may need various control signals to be synchronized. Accordingly, there is a continuing need for improved circuits and methods for synchronizing control signals for use in receivers and other communications circuits.

SUMMARY OF THE INVENTION

The present technology may best be understood by referring to the following description and accompanying drawings that are used to illustrate embodiments of the present technology directed toward synchronous reset circuits.

In one aspect, a synchronous reset circuit can include a first sample sub-circuit, a phase relation sub-circuit, a second sample sub-circuit, and a selector sub-circuit. The first sample sub-circuit can be configured to sample a reset signal based on a low-speed clock reference signal to generate a series of sampled reset signals. The phase relation sub-circuit can be configured to measure a phase relation between a first selected one of the series of sampled reset signals and a plurality of phase shifted instances of a high-speed clock signal to generate a reset trigger signal for each of the plurality of lanes. The second sample sub-circuit can be configured to sample a second selected one of the series of sampled reset signals based on the high-speed clock signal to generate a positive sampled reset signal and a negative sampled reset signal. The selector sub-circuit can be configured to select between the positive sampled reset signal and the negative sampled reset signal based on the reset trigger signals for the plurality of lanes to generate a synchronous reset signal.

In another aspect, a synchronous reset circuit can include a plurality of Data flip-flops (D flops), a phase detector and a selector. A first set of the plurality of D-flops can be coupled in series to sample a reset signal based on a low-speed clock reference signal to generate a series of sampled reset signals. A second set of the plurality of D-flops can sample a set of phase-shifted instance of a high-speed clock based on a first selected one of the series of sampled reset signals to generate a set of sampled phase-shifted clock signals. The phase detector can determine a first reset trigger signal from the series of sampled phase shifted clock signals. A third set of the plurality of D-flops can sample a second selected one of the series of sampled reset signals to generate a positive sampled reset signal and a negative sampled reset signal. The selector can select the positive sampled reset signal or the negative sampled reset signal based on a set of reset trigger signals including the first reset trigger signal.

In another aspect, a receiver circuit can include a plurality of samplers, a plurality of de-serializers, and a reset sub-circuit. Each sampler can include an input for receiving a corresponding one of a plurality of input signals, and a clock input for receiving a high-speed clock signal. Each de-serializer can be coupled to a corresponding one of the plurality of samplers, each de-serializer can include a reset input for receiving a synchronous reset signal, wherein transitions of the synchronous reset signal are synchronized to transitions of the high-speed clock signal. The reset sub-circuit can be configured to sample the reset signal based on a low-speed clock reference signal to generate a series of sampled reset signals. The reset sub-circuit can be further configured to measure a phase relation between a first selected one of the series of sampled reset signals and the high-speed clock signal at the clock input of each sampler to generate reset trigger signals corresponding to each sampler. The reset sub-circuit can be further configured to sample a second selected one of the series of sampled reset signals based on the high-speed clock signal to generate a positive sampled reset signal and a negative sampled reset signal. The reset sub-circuit can be further configured to select between the positive sampled reset signal and the negative sampled reset signal based on the reset trigger signals corresponding to each sampler to generate the synchronous reset signal.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1:
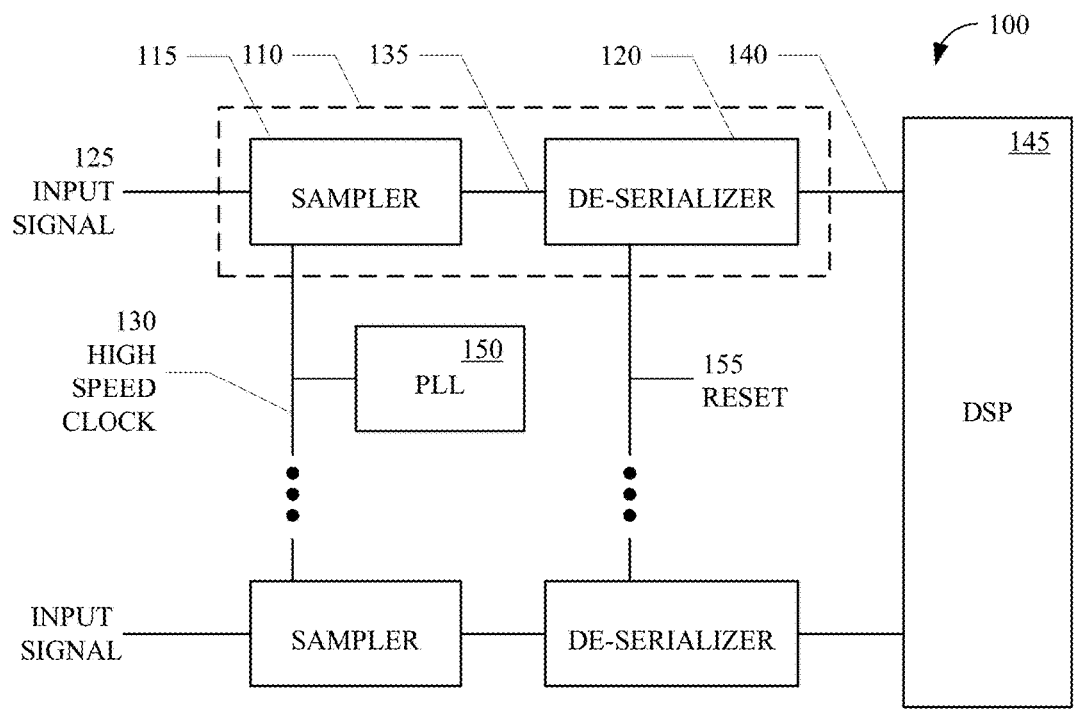
FIG. 1 shows a block diagram of a multi-lane coherent receiver circuit, in accordance with aspects of the present technology.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

FIG. 1 shows a multi-lane coherent receiver circuit, in accordance with aspects of the present technology. Each lane 110 of the multi-lane coherent receiver 100 can include a sampler 115 and a de-serializer 120. The sampler 115 can be configured to sample an input signal 125 based on a high-speed clock signal 130. The de-serializer 120 can be configured to de-serialized the serial data 135 of the sampled input signal to lower speed parallel data 140. The lower speed parallel data 140 from the plurality of lanes can be processed by a Digital Signal Processor (DSP) 145 of the multi-lane coherent receiver 100.

In aspects, the high-speed clock 130, generated by a Phase-Locked Loop (PLL) 150 or other similar circuit, can be shared by the plurality of lanes. It is possible to get each instance of the high-speed clock signal 130 to be synchronous at the inputs of the samplers 115. With the synchronous high-speed clocks 130 at the input of the samplers 115, the high-speed sampled data 135 can be well aligned between lanes. In aspects, the data order in the de-serialized low speed data 140 can be determined by the release of a reset signal 155. The reset signal 155 can be configured to enable clocks and/or reset data registers of the der-serializer 120. The reset signal 155 can be generated by a state machine which can be controlled by software or firmware, and therefore it is not synchronous to the high-speed clock 130 in each lane.

Figure 2:
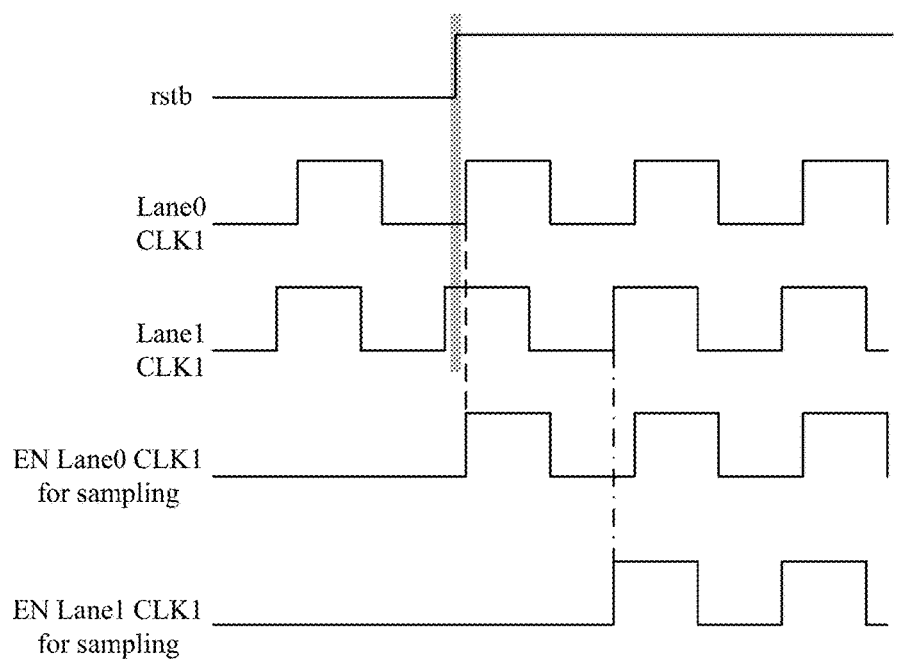
FIG. 2 shows a timing diagram of a lane clock reset, in accordance with aspects of the present technology.

In aspects, the reset release can occur during metastable state of lip-flops in the clock generation circuits or data registers. Referring now to FIG. 2, one example of a lane clock reset, in accordance with aspects of the present technology, is shown. The timing diagram illustrate the reset signal (rstb) 155, the high-speed clock 130 in a first and second lane of the receiver 100, and clock enables in the corresponding lanes. Jitter or skew in either the high-speed clock or the reset signal can cause different clock startup timing, which can translate to different data orders between different lanes.

Figure 3A:
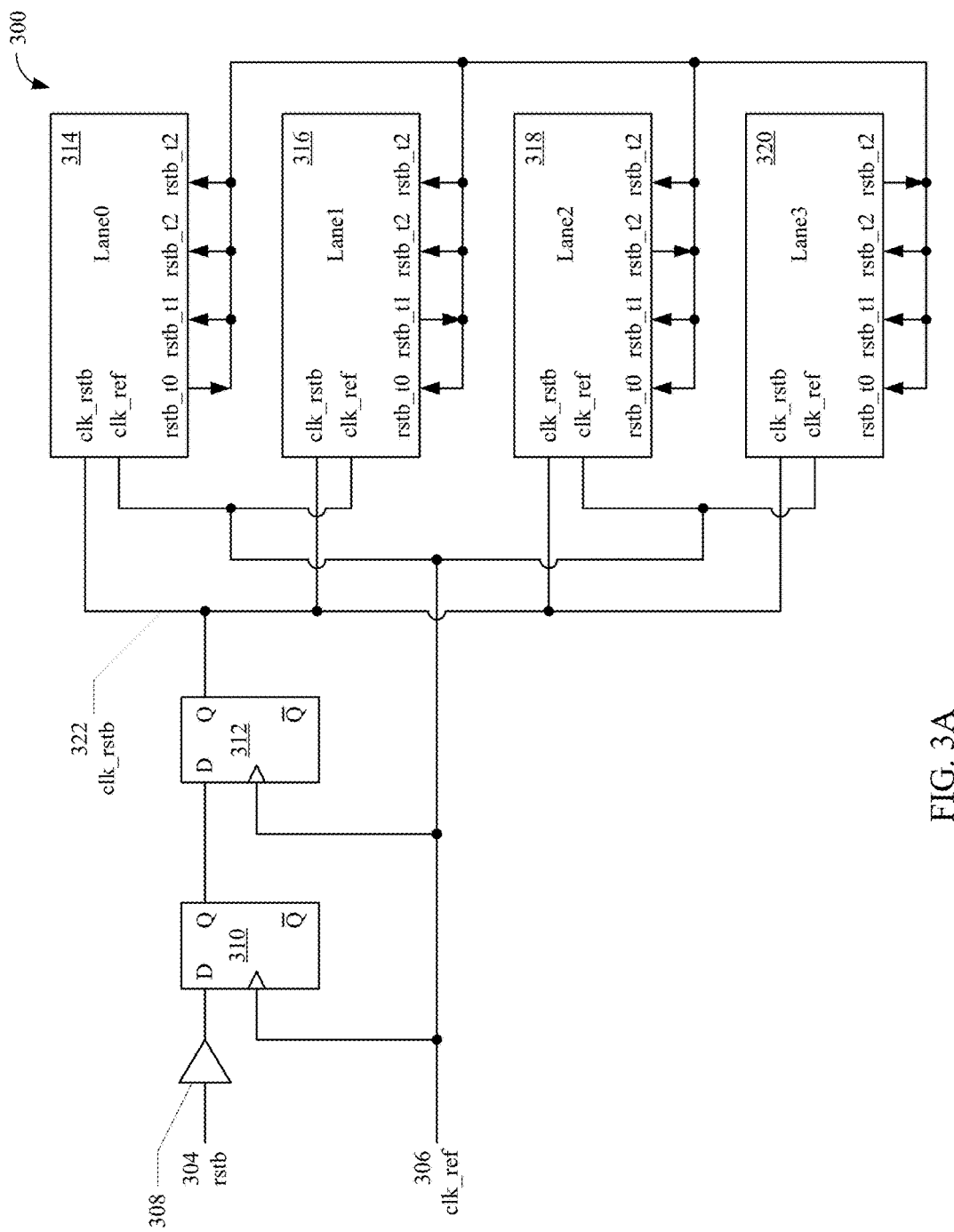
FIGS. 3A and 3B shows a block diagram of a multi-lane synchronous reset circuit, in accordance with aspects of the present technology.
Figure 3B:
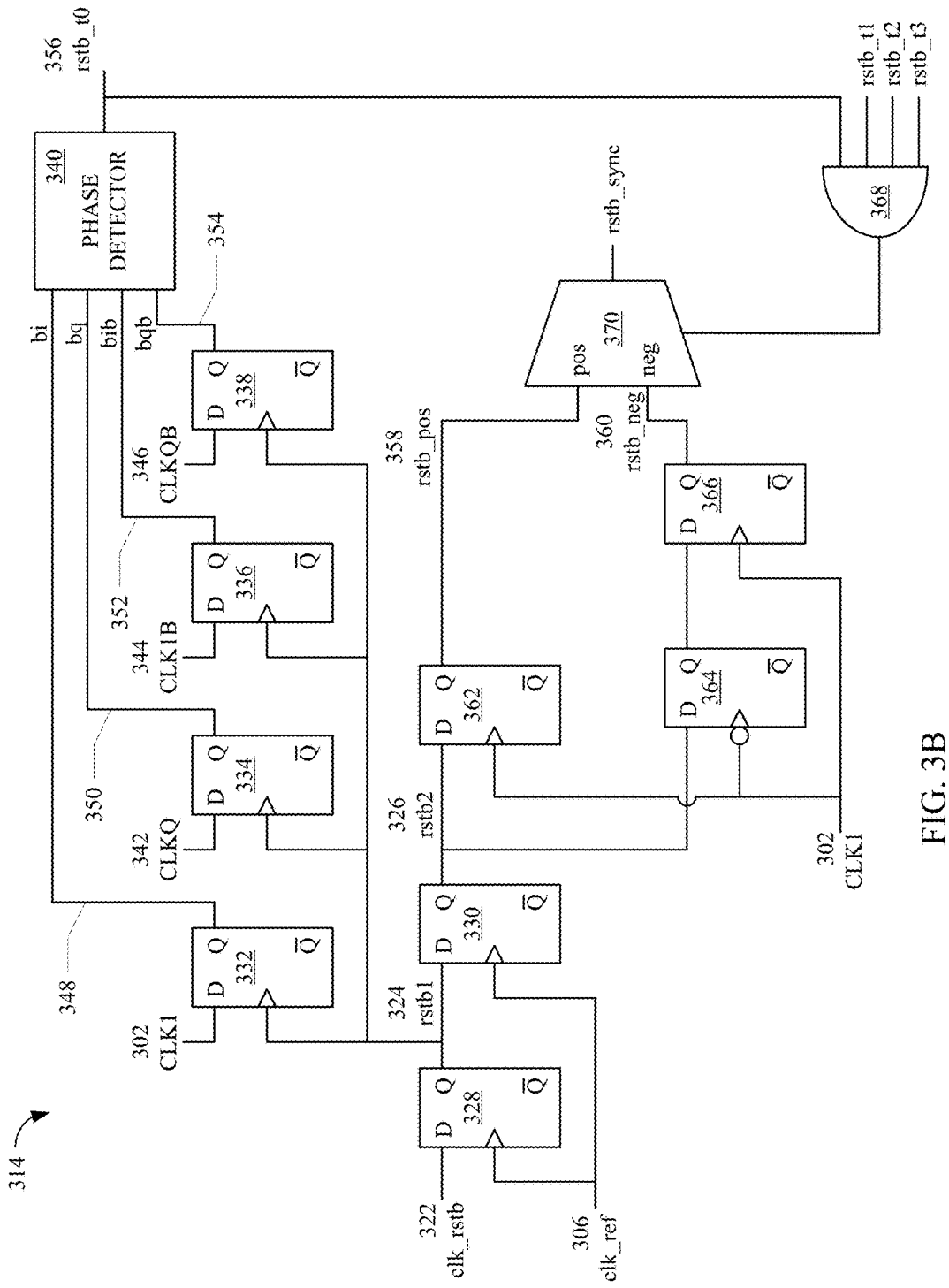

Referring now to FIGS. 3A and 3B, a multi-lane synchronous reset circuit, in accordance with aspects of the present technology, is shown. The synchronous reset circuit 300 can receive a high-speed clock signal (CLK) 302, a reset signal (rstb) 304, and a low-speed clock reference signal (clk_ref) 306. The high-speed clock signal (CLK) 302 and the reset signal (rstb) 304 can be asynchronous. The low-speed clock reference signal (clk_ref) 306 can have a fixed phase relation with the high-speed clock signal (CLK) 302. The frequency of the low-speed clock reference signal (clk_ref) 306 can be 1/N of the frequency of the high-speed clock signal (CLK) 302, wherein N is an integer. The multi-lane synchronous reset circuit 300 can include a common portion 308-312, and portions 314-320 associated with corresponding lanes of the multi-lane coherent receiver 100. An exemplary portion corresponding to Lane0 314 of the multi-line coherent receiver 100 is illustrated in FIG. 3B.

In aspects, the synchronous reset circuit 300 can be configured to sample the reset signal (rstb) based on the low-speed clock reference signal (clk_ref) 306 to generate a series of sampled reset signals clk_rstb 322, rstb1 324, rstb2 326. The sampled reset signals clk_rstb 322, rstb1 324, rstb2 326 can be aligned to the low-speed clock reference signal (clk_ref) 306. Because the low-speed clock reference signal (clk_ref) 306 has a fixed phase relation with the high-speed clock signal (CLK) 302, the sampled reset signals clk_rstb 322, rstb1 324, rstb2 326 can also be aligned to the high-speed clock signal (CLK) 302. In one implementation, a first sample sub-circuit can include a first set of series coupled Data flip-flops (D-flops) 310, 312, 328, 330. The reset signal (rstb) 304 can propagate through a first and second D-flop 310, 312 upon the rising edge of the low-speed clock reference signal (clk_ref) 306 to generate a first sampled reset signal (clk_rstb) 322. The first sampled reset (clk-rstb) 322 can propagate through a third D-flop 328 upon the rising edge of the low-speed clock reference signal (clk_ref) 306 to generate a second sampled reset signal (rstb1) 324. The second sampled reset signal (rstb1) 324 can propagate through a fourth D-flop 330 upon the rising edge of the low-speed clock reference signal (clk_ref) 306 to generate a third sampled reset signal (rstb2) 326. The reset sample sub-circuit can optionally include a buffer 308 to buffer the reset signal (rstb) 304 received by the synchronous reset circuit 300.

In aspects, the synchronous reset circuit 300 can be further configured to measure a phase relation between the sampled reset signal (rstb) 304 and the high-speed clock signal (CLK1) 302 in each lane. In one implementation, a phase relation sub-circuit can include a second set of D-flops 332-338 and a phase detector 340. The second set of D-flops 332-338 can sample respective phase-shifted instances of the high-speed clock signal (CLK1) 302 upon the rising edge of the second sampled reset signal (rstb1) 324. In one instance, phase quadrature shifted clock signals CLK1 302, CLKQ 342, CLK1B 344, CLKQB 346 can be sampled by a respective D-flop 332-338 to generate sampled phase quadrature signals bi 348, bq 350, bib 352, bqb 354. The phase detector can compare the sampled phase quadrature signals bi 348, bq 350, bib 352, bqb 354 to generate a reset trigger signal 356 for the respective lane.

In aspects, the synchronous reset circuit 300 can be further configured to sample third reset signal (rstb2) based on the high-speed clock signal (CLK1) 302 and its opposite phase clock signal to generate a positive sampled reset signal (rstb_pos) 358 and a negative sampled reset signal (rstb_neg) 360. In one implementation, a second sample circuit can include a second set of D-flops 362-366. The third reset signal (rstb2) can propagate through a first D-flop 362 upon the rising edge of the high-speed clock signal (CLK1) 302 to generate the positive sampled reset signal (rstb_pos) 358. The third reset signal (rstb2) can also propagate through a second D-flop 364 upon the falling edge of the high-speed clock signal (CLK1) 302 and then through a third D-flop 366 upon the rising edge of the high-speed clock signal (CLK1) 302 to generate the negative sampled reset signal (rstb_neg) 360.

In aspects, the synchronous reset circuit 300 can be further configured to select between the positive sampled reset signal (rstb_pos) 358, and a negative sampled reset signal (rstb_neg) 360 based on the reset trigger signal from the phase relation sub-circuits of the plurality of lanes. In one implementation, a selector sub-circuit can include an AND-gate 368 and a multiplexor 370. The AND-gate 368 can perform the Boolean AND-Function on the reset trigger signals rstb_t0 356, rstb_t1, rstb_t2, rstb_t3 from the phase relations sub-circuits from a plurality of lanes. The output of the AND-gate 368 can be input to the control gate of the multiplexor 370 to select between the positive sampled reset signal (rstb_pos) 358, and a negative sampled reset signal (rstb_neg) 360.

Figures 4, 5:
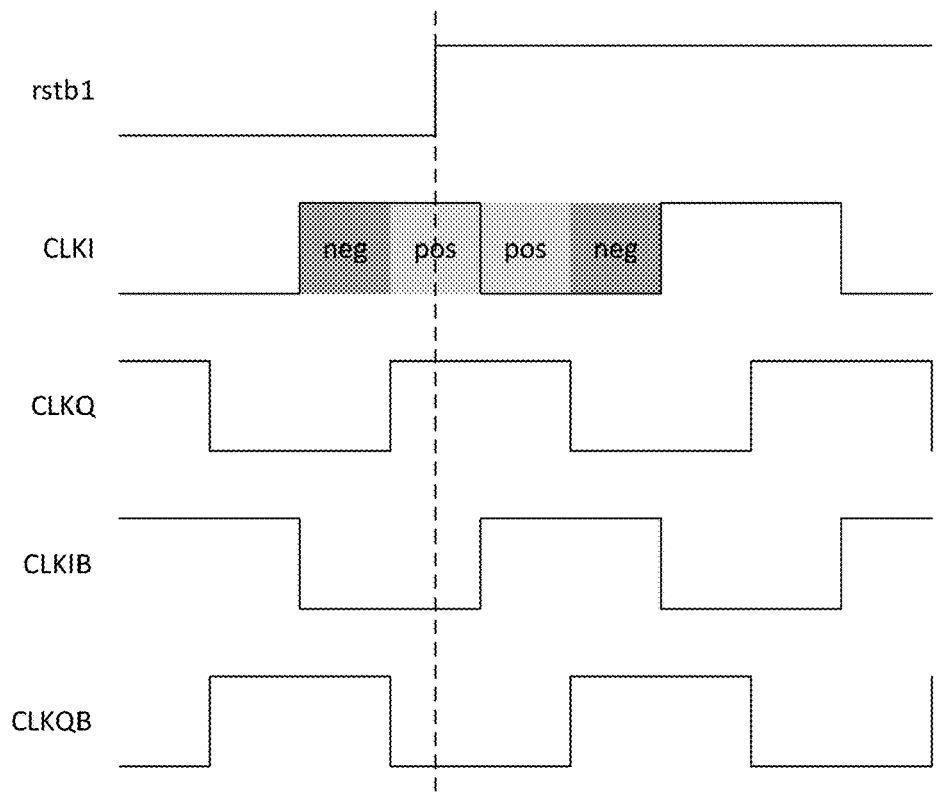
FIG. 4 shows a timing diagram of an exemplary second sampled reset signal and high-speed quadrature clocks, in accordance with aspects of the present technology.
FIG. 5 shows a state table for the phase detector, in accordance with aspects of the present technology.

Referring now to FIG. 4, an exemplary timing diagram of the second sampled reset signal (rstb1) and high-speed quadrature clocks (CLK1, CLKQ, CLK1B, CLKQB) is shown. The high-speed quadrature clocks (CLK1, CLKQ, CLK1B, CLKQB) can be shifted by 90° relative to each other. In one example, if the second sampled reset signal (rstb1) 324 is near the negative edge of the CLKI signal, later CLK1 signal pulses should sample the third sampled reset signal (rstb2) with the positive edge of the high-speed clock signal (CLK1) 302. If the second sampled reset signal (rstb1) 324 is near the positive edge of the CLKI signal, later CLK1 signal pulses should sample the third sampled reset signal (rstb2) with the negative edge of the high-speed clock signal (CLK1) 302. The low-speed reference clock (clk_ref) 306 can have an arbitrary phase relation with regard to the high-speed quadrature clocks (CLK1 302, CLKQ 342, CLK1B 344, CLKQB 346). Because the second reset signal (rstb1) 324 can be aligned with an edge of the low-speed reference clock (clk_ref) 306, the transition timing of the second reset signal (rstb1) 324 can also be arbitrary with regard to the quadrature clocks (CLK1 302, CLKQ 342, CLK1B 344, CLKQB 346).

Referring now to FIG. 5, a state table for the phase detector 340 is shown. The phase detector 340 can generate a reset trigger signal rstb_t0 356 for the first lane based on the state of the sampled phase quadrature signals bi 348, bq 350, bib 352, bqb 354. The exemplary timing illustrated in FIG. 4 is associated with the third row in FIG. 5. In such example, when the sampled state of CLK1 302 and CLKQ 342 are both high and the sampled state of CLKIB 344 and CLKQB 346 are both low, the raising edge of the second sampled reset signal (rstb1) 324 should be used.

Figure 6:
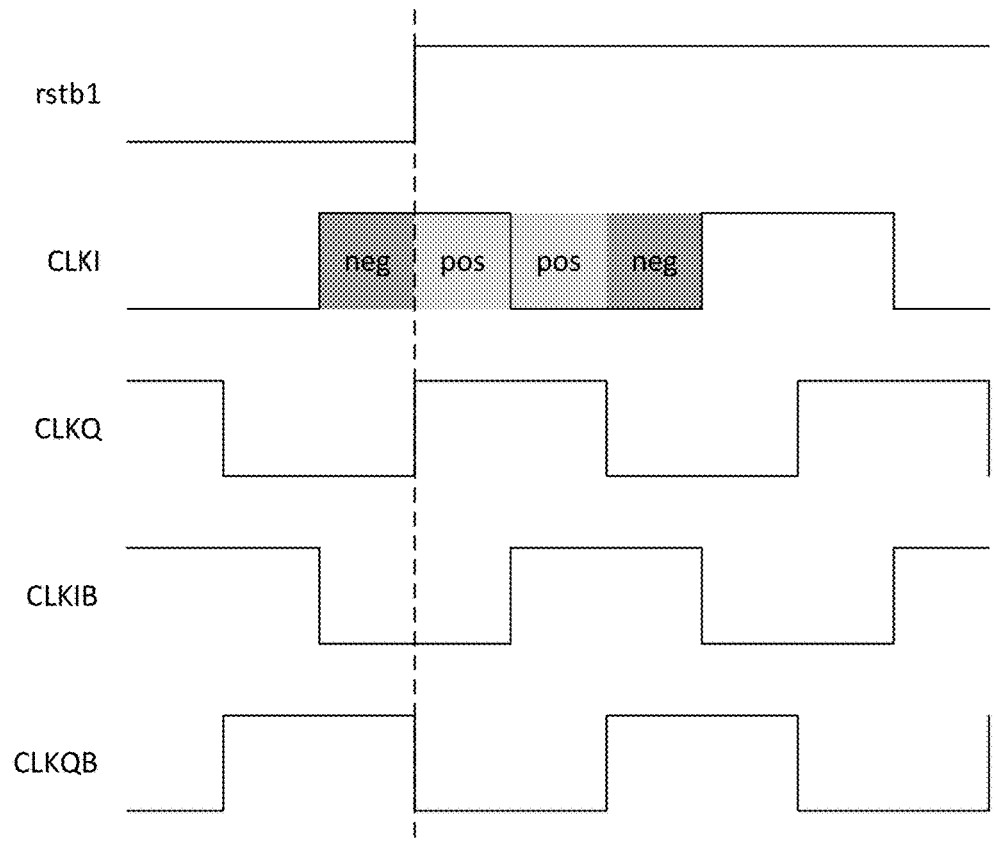
FIG. 6 shows a timing diagram of an exemplary second sampled reset signal and high-speed quadrature clocks, in accordance with aspects of the present technology.

Referring now to FIG. 6, an exemplary timing diagram of the second sampled reset signal (rstb1) aligned with the high-speed quadrature clocks (CLK1, CLKQ, CLK1B, CLKQB), is shown. The exemplary timing illustrated in FIG. 6 is associated with the second row in FIG. 5. When the second reset signal (rstb1) 324 transition is aligned with the CLKQ 342 and CLKQB 346 edges, either the positive or negative edge may be selected for sampling. Both edges have the same setup/hold time margin. However, the same edge should be selected for the plurality of lanes to avoid a timing error of a half cycle of the quadrature clock. Therefore, a combinational logic 368, 370 that reads phase detector result from the plurality of lanes and controls the selectors in each lane can be used to complete an all-lane handshake.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:
1. A receiver circuit comprising:
a plurality of samplers, each sampler including an input for receiving a corresponding one of a plurality of input signals, and a clock input for receiving a high-speed clock signal;
a plurality of de-serializers, each de-serializer coupled to a corresponding one of the plurality of samplers, each de-serializer including a reset input for receiving a synchronous reset signal, wherein transitions of the synchronous reset signal is synchronized to transitions of the high-speed clock signal;
a reset sub-circuit including an input for receiving the high-speed clock signal, an input for receiving an reset signal and an input for receiving a low-speed clock reference signal, the reset sub-circuit configured to;
sample the reset signal based on the low-speed clock reference signal to generate a series of sampled reset signals;
measure a phase relation between a first selected one of the series of sampled reset signals and the high-speed clock signal at the clock input of each sampler to generate reset trigger signals corresponding to each sampler;

sample a second selected one of the series of sampled reset signals based on the high-speed clock signal to generate a positive sampled reset signal and a negative sampled reset signal; and select between the positive sampled reset signal and the negative sampled reset signal based on the reset trigger signals corresponding to each sampler to generate the synchronous reset signal.

2. The receiver circuit of claim 1, wherein the high-speed clock signal and the reset signal are asynchronous signals.

3. The receiver circuit of claim 1, wherein the low-speed clock reference signal and the high-speed clock signal have a fixed phase relation.

4. The receiver circuit of claim 1, wherein the frequency of the low-speed clock reference signal is 1/N of the frequency of the high-speed clock signal.

5. The receiver circuit of claim 1, wherein the series of sampled reset signals are aligned to the low-speed clock reference signal.

6. The receiver circuit of claim 1, wherein the series of sampled reset signals are aligned to the high-speed clock signal.

7. The receiver circuit of claim 1, wherein the reset sub-circuit configured to sample the reset signal based on the low-speed clock reference signal to generate the series of sampled reset signals comprises:

a first Data flip-flop (D-flop) and a second D-flop coupled in series, the first D-flop including a data input for receiving the reset signal, a clock input for receiving the low-speed clock reference signal, the second D-flop including a data input coupled to a data output of the first D-flip, a clock input for receiving the low-speed clock reference signal, and latching the state of the reset signal as a first sampled reset signal at a data output of the second D-flop upon raising edges of the low-speed clock reference signal;

a third D-flop including a data input for receiving the first sampled reset signal, a clock input for receiving the low-speed clock reference signal and latching the state of the first sampled reset signal at a data output of the third D-flop as a second sampled reset signal upon raising edges of the low-speed clock reference signal; and a fourth D-flop including a data input for receiving the second sampled reset signal, a clock input for receiving the low-speed clock reference signal and latching the state of the second sampled reset signal at a data output of the fourth D-flop as a third sampled reset signal upon raising edges of the low-speed clock reference signal.

8. The receiver circuit of claim 7, wherein the reset sub-circuit configured to measure the phase relation between a first selected one of the series of sampled reset signals and the high-speed clock signal at the clock input of each sampler to generate reset trigger signals corresponding to each given sampler comprises:

a fifth D-flop including a data input for receiving a first phase shifted instance of the high-speed clock signal, a clock input for receiving the second sampled reset signal, and latching the state of the first phase shifted instance of the high-speed clock signal at a data output of the fifth D-flop as a first sampled phase shifted clock signal upon raising edges of the second sampled reset signal;

a sixth D-flop including a data input for receiving a second phase shifted instance of the high-speed clock signal, a clock input for receiving the second sampled reset signal, and latching the state of the second phase shifted instance of the high-speed clock signal at a data output of the sixth D-flop as a second sampled phase shifted clock signal upon raising edges of the second sampled reset signal;

a seventh D-flop including a data input for receiving a third phase shifted instance of the high-speed clock signal, a clock input for receiving the second sampled reset signal, and latching the state of the third phase shifted instance of the high-speed clock signal at a data output of the seventh D-flop as a third sampled phase shifted clock signal upon raising edges of the second sampled reset signal;

an eighth D-flop including a data input for receiving a fourth phase shifted instance of the high-speed clock signal, a clock input for receiving the second sampled reset signal, and latching the state of the fourth phase shifted instance of the high-speed clock signal at a data output of the eighth D-flop as a fourth sampled phase shifted clock signal upon raising edges of the second sampled reset signal; and a phase detector for comparing the first, second third and fourth sampled phase shifted clock signals to generating a reset trigger signal corresponding to the given sampler.

9. The receiver circuit of claim 8, wherein the reset sub-circuit configured to sample the second selected one of the series of sampled reset signals based on the high-speed clock signal to generate the positive sampled reset signal and the negative sampled reset signal comprises:

a ninth D-flop including a data input for receiving the third sampled reset signal, a clock input for receiving the high-speed clock signal, and latching the state of the third sampled reset signal at a data output of the ninth D-flop as the positive sampled reset signal upon raising edges of the high-speed clock signal; and a tenth D-flop and an eleventh D-flop coupled in series, the tenth D-flop including a data input for receiving the third sampled reset signal, a clock input for receiving an opposite phase instance of the high-speed clock signal, the eleventh D-flop including a data input coupled to a data output of the tenth D-flop, a clock input for receiving the high-speed clock signal, and latching the state of the third sampled reset signal at a data output of the eleventh D-flop as the negative sampled reset signal upon raising edges of the high-speed clock signal.

10. The receiver circuit of claim 9, wherein the reset sub-circuit configured to select between the positive sampled reset signal and the negative sampled reset signal based on the reset trigger signals corresponding to each sampler to generate the synchronous reset signal comprises:

an AND-gate including inputs for receiving corresponding reset trigger signals for the plurality of samplers; and a multiplexor including a first input for receiving the positive sampled reset signal, a second input for receiving the negative sampled reset signal, a control input coupled to an output of the AND-gate, and a output of the multiplexor to output a selected one of the positive or negative sampled reset signal as the synchronous reset signal.

11. A synchronous reset circuit comprising:
a first sample sub-circuit configured to sample a reset signal based on a low-speed clock reference signal to generate a series of sampled reset signals;
a phase relation sub-circuit configured to measure a phase relation between a first selected one of the series of sampled reset signals and a plurality of phase shifted instances of a high-speed clock signal for each of a plurality of lanes to generate a reset trigger signal for each of the plurality of lanes;
a second sample sub-circuit configured to sample a second selected one of the series of sampled reset signals based on the high-speed clock signal to generate a positive sampled reset signal and a negative sampled reset signal; and
a selector sub-circuit configured to select between the positive sampled reset signal and the negative sampled reset signal based on the reset trigger signals for the plurality of lanes to generate a synchronous reset signal.

12. The synchronous reset circuit of claim 11, wherein the high-speed clock signal and the reset signal are asynchronous signals.

13. The synchronous reset circuit of claim 11, wherein the low-speed clock reference signal and the high-speed clock signal have a fixed phase relation.

14. The synchronous reset circuit of claim 11, wherein the frequency of the low-speed clock reference signal is 1/N of the frequency of the high-speed clock signal.

15. The synchronous reset circuit of claim 11, wherein the synchronous reset signal and the high-speed clock signal are synchronous signals.

16. A synchronous reset circuit comprising:
a first set of a plurality of Data flip-flops (D-flops) coupled in series to sample a reset signal based on a low-speed clock reference signal to generate a series of sampled reset signals;
a second set of the plurality of D-flops to sample a set of phase shifted instance of a high-speed clock based on a first selected one of the series of sampled reset signals to generate a set of sampled phase shifted clock signals;
a phase detector to determine a first reset trigger signal from the series of sampled phase shifted clock signals;
a third set of the plurality of D-flops to sample s second selected one of the series of sampled reset signals to generate a positive sampled reset signal and a negative sampled reset signal;
a selector to select the positive sampled reset signal or the negative sampled reset signal based on a set of reset trigger signals including the first reset trigger signal.

17. The synchronous reset circuit of claim 16, wherein the first set of the plurality of D-flops comprise:
a first D-flop and a second D-flop coupled in series, the first D-flop including a data input for receiving the reset signal, a clock input for receiving the low-speed clock reference signal, the second D-flop including a data input coupled to a data output of the first D-flip, a clock input for receiving the low-speed clock reference signal, and latching the state of the reset signal as a first sampled reset signal at a data output of the second D-flop upon raising edges of the low-speed clock reference signal;
a third D-flop including a data input for receiving the first sampled reset signal, a clock input for receiving the low-speed clock reference signal and latching the state of the first sampled reset signal at a data output of the third D-flop as a second sampled reset signal upon raising edges of the low-speed clock reference signal; and
a fourth D-flop including a data input for receiving the second sampled reset signal, a clock input for receiving the low-speed clock reference signal and latching the state of the second sampled reset signal at a data output of the fourth D-flop as a third sampled reset signal upon raising edges of the low-speed clock reference signal.

18. The synchronous reset circuit of claim 17, wherein the second set of the plurality of D-flops comprises:
a fifth D-flop including a data input for receiving a first phase shifted instance of the high-speed clock signal, a clock input for receiving the second sampled reset signal, and latching the state of the first phase shifted instance of the high-speed clock signal at a data output of the fifth D-flop as a first sampled phase shifted clock signal upon raising edges of the second sampled reset signal;
a sixth D-flop including a data input for receiving a second phase shifted instance of the high-speed clock signal, a clock input for receiving the second sampled reset signal, and latching the state of the second phase shifted instance of the high-speed clock signal at a data output of the sixth D-flop as a second sampled phase shifted clock signal upon raising edges of the second sampled reset signal;
a seventh D-flop including a data input for receiving a third phase shifted instance of the high-speed clock signal, a clock input for receiving the second sampled reset signal, and latching the state of the third phase shifted instance of the high-speed clock signal at a data output of the seventh D-flop as a third sampled phase shifted clock signal upon raising edges of the second sampled reset signal; and
an eighth D-flop including a data input for receiving a fourth phase shifted instance of the high-speed clock signal, a clock input for receiving the second sampled reset signal, and latching the state of the fourth phase shifted instance of the high-speed clock signal at a data output of the eighth D-flop as a fourth sampled phase shifted clock signal upon raising edges of the second sampled reset signal.

19. The synchronous reset circuit of claim 17, wherein third set of the plurality of D-flops comprise:
a ninth D-flop including a data input for receiving the third sampled reset signal, a clock input for receiving the high-speed clock signal, and latching the state of the third sampled reset signal at a data output of the ninth D-flop as the positive sampled reset signal upon raising edges of the high-speed clock signal; and
a tenth D-flop and an eleventh D-flop coupled in series, the tenth D-flop including a data input for receiving the third sampled reset signal, a clock input for receiving an opposite phase instance of the high-speed clock signal, the eleventh D-flop including a data input coupled to a data output of the tenth D-flop, a clock input for receiving the high-speed clock signal, and latching the state of the third sampled reset signal at a data output of the eleventh D-flop as the negative sampled reset signal upon raising edges of the high-speed clock signal.

20. The synchronous reset circuit of claim 17, wherein the selector comprises:
an AND-gate including inputs for receiving set of reset trigger signals including the first reset trigger signal; and a multiplexor including a first input for receiving the positive sampled reset signal, a second input for receiving the negative sampled reset signal, a control input coupled to an output of the AND-gate, and a output of the multiplexor to output a selected one of the positive or negative sampled reset signal as the synchronous reset signal.

* * * * *